United States Patent
Mundt

Patent Number: 5,718,511
Date of Patent: Feb. 17, 1998

[54] TEMPERATURE MAPPING METHOD

[75] Inventor: Randall S. Mundt, Pleasanton, Calif.

[73] Assignee: Lam Research Corporation, Fremont, Calif.

[21] Appl. No.: 497,659

[22] Filed: Jun. 30, 1995

[51] Int. Cl.⁶ .................................................. G01K 3/00
[52] U.S. Cl. ........................................... 374/137; 374/162
[58] Field of Search .......................... 116/207; 364/557; 374/110, 102, 106, 161, 162, 137

[56] References Cited

U.S. PATENT DOCUMENTS

| | | |
|---|---|---|
| 3,752,915 | 8/1973 | Parker et al. . |
| 3,817,622 | 6/1974 | Billman et al. . |
| 3,833,851 | 9/1974 | Jobes, Jr. et al. . |
| 4,064,872 | 12/1977 | Caplan .................................. 374/162 |
| 4,101,696 | 7/1978 | Jennen et al. ........................ 374/137 |
| 4,602,981 | 7/1986 | Chen et al. . |
| 4,675,072 | 6/1987 | Bennett et al. . |
| 4,682,605 | 7/1987 | Hoffman . |
| 4,687,344 | 8/1987 | Lillquist . |
| 4,696,580 | 9/1987 | Kameda ................................ 374/162 |
| 4,707,147 | 11/1987 | Aoki et al. . |
| 4,825,447 | 4/1989 | Bramhall ............................. 374/162 |
| 4,846,920 | 7/1989 | Keller et al. . |
| 4,902,139 | 2/1990 | Adiutori . |
| 5,045,149 | 9/1991 | Nulty . |
| 5,082,517 | 1/1992 | Moslehi . |
| 5,103,182 | 4/1992 | Moslehi . |
| 5,147,520 | 9/1992 | Bobbio . |
| 5,159,564 | 10/1992 | Swartzel et al. .................... 374/178 |
| 5,167,748 | 12/1992 | Hall . |
| 5,444,241 | 8/1995 | Del Grande et al. . |

*Primary Examiner*—G. Bradley Bennett
*Attorney, Agent, or Firm*—Burns, Doane, Swecker & Mathis, L.L.P.

[57] ABSTRACT

In a method for mapping temperatures reached by an object during heating, a thermally sensitive material which, when heated, undergoes a gradual irreversible change is applied to a surface of an object. The object and the material applied thereto are heated. An amount of irreversible change in the heated material applied on the object is determined, the amount of irreversible change in the heated material being indicative of temperatures reached at multiple points on the object.

27 Claims, 1 Drawing Sheet

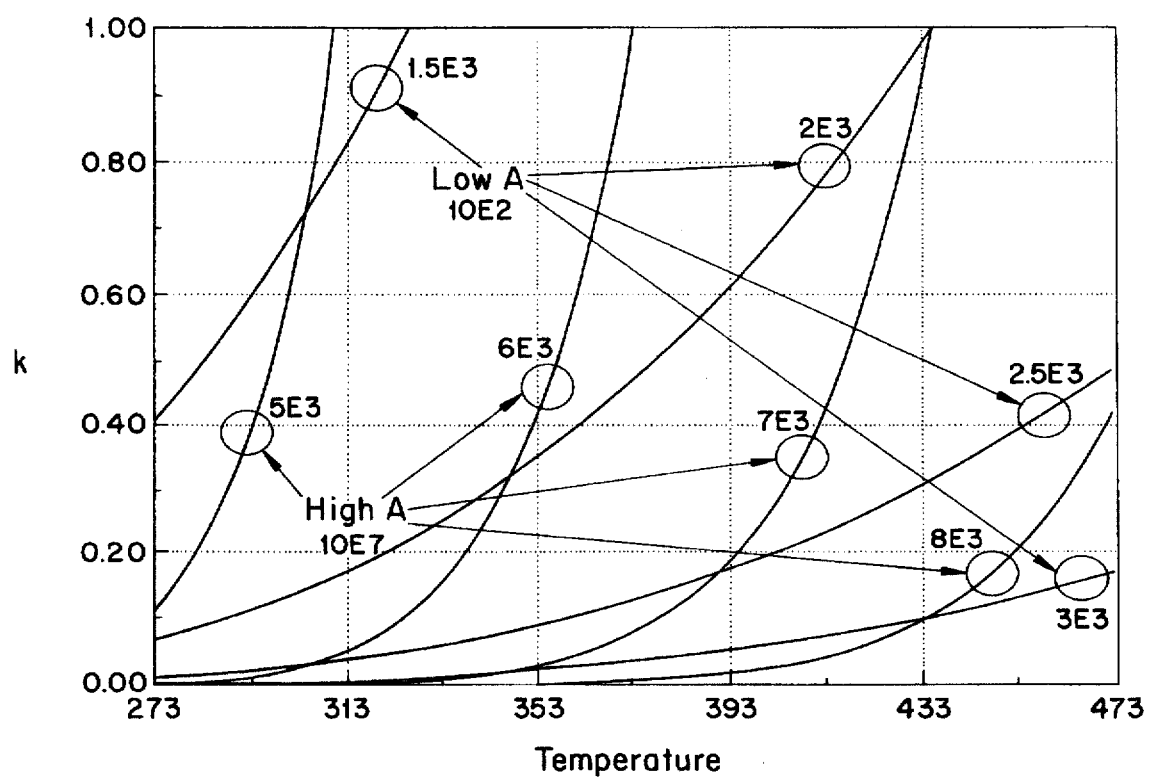

TEMPERATURE MAPPING METHOD

FIELD OF THE INVENTION

The present invention relates to a method for mapping temperatures of an object subjected to heating.

BACKGROUND OF THE INVENTION

In various manufacturing operations such as semiconductor wafer processing for manufacturing integrated circuits, it is extremely important to know the temperature uniformity of an object during heating. Known temperature measuring equipment, however, tends to suffer from various disadvantages when exposed to adverse environmental conditions. Measurement techniques which are compatible with specific process environments typically require special feedthroughs, optical windows, or special noise filtering.

For example, in semiconductor wafer processing apparatuses, one technique for measuring or mapping temperatures involves the use of multiple thermocouples on or adjacent to the wafer. This technique, however, is not well suited for processing environments wherein electrical feedthroughs are adversely affected by the chemical reaction occurring in the processing chamber or wherein RF fields interfere with electrical signals. Fiber optic arrangements may be used to measure or map temperatures on a wafer during processing and are less susceptible to the problems of noise to which thermocouples are subject, however, such arrangements are much more difficult to set up.

Where optical access to the wafer is possible, infra red cameras may be used to measure or map temperatures. This is not, however, always possible. Also, infra red cameras are not well-suited for temperature monitoring at lower temperatures. Still another technique for measuring or mapping temperatures involves the use of a plurality of "labels" applied on a test wafer at various locations. During processing, the color of the labels changes when a specific temperature is reached. After processing, the temperatures reached at the various points on the wafer are determined by determining how the labels have changed in color.

It is, accordingly, desirable to provide a method by which temperature distribution on an object that has been processed may be monitored and recorded.

It is further desirable to provide such a method that allows a very high spatial resolution.

It is still further desirable to provide such a method that requires no modification to ordinary process equipment.

SUMMARY OF THE INVENTION

According to one aspect of the present invention, a method for mapping temperatures reached by an object during heating is provided. According to the method, a thermally sensitive material which, when heated, undergoes a gradual irreversible change, is applied to a surface of an object. The object and the material applied thereto are heated. An amount of irreversible change in the heated material applied on the object is determined, the amount of irreversible change in the heated material being indicative of temperatures reached at multiple points on the object.

According to another aspect of the present invention, a method for monitoring semiconductor wafer processing equipment is provided. According to the method, a temperature map of temperatures reached by a semiconductor wafer during processing in a plasma reaction chamber is produced by applying, to a surface of a semiconductor wafer, a thermally sensitive material which, when heated, undergoes a gradual irreversible change, placing the semiconductor wafer in the plasma reaction chamber and heating the semiconductor wafer and the material applied thereto for a period of time, and determining an amount of irreversible change in the heated material applied on the semiconductor wafer at multiple points on the semiconductor wafer. Semiconductor wafer processing conditions of the plasma reaction chamber are subsequently adjusted based on the amount and pattern of irreversible change.

BRIEF DESCRIPTION OF THE DRAWING

The features and advantages of the present invention are well understood by reading the following detailed description in conjunction with the following graph in which reaction rate constants are plotted against temperature for various reaction kinetics.

DETAILED DESCRIPTION OF THE PREFERRED EMBODIMENT

The present invention expands from the well known and understood phenomena that the rate of a chemical reaction depends upon temperature. A first order chemical reaction is one for which the rate of reaction is dependent upon the concentration of a single starting material, wherein the term concentration is used to broadly cover characteristics such as properties, such as refractive index or color, of the material, quantity of the material, percent amount of the material relative to another material, and phase, i.e., solid, liquid, vapor, or the material. In common chemical notation, this is expressed as:

$$\text{Eqn. 1:} -d[C]/dt = k[C]$$

where:

$-d[C]/dt$ = derivative (rate of change) of the concentration of material C;

k = reaction rate constant; and

[C] = concentration of material C.

Integrating and recasting this equation produces:

$$\text{Eqn. 2:} \ln([Ci]/[Ct]) = kt$$

where:

[Ci] = initial concentration of material C;

[Ct] = concentration of material C at time t;

k = reaction rate constant; and t = time elapsed.

The commonly observed increase in reaction rate (k) as a function of temperature is described by the Arrhenius equation, wherein:

$$\text{Eqn. 3:} k = A^{(-Ea/RT)}$$

where:

k = reaction rate constant at temperature T;

A = a characteristic constant of the reaction;

Ea = activation energy of the reaction;

R = gas constant (8.31341 Joules/° K. mole); and

T = Temperature, ° K.

A and Ea are both constant for reasonably small changes in temperature. Thus, the reaction rate increases exponentially with temperature where A establishes the upper bound on the allowed rate and Ea determines the sensitivity. The combination of A and Ea can produce a wide range of reaction rate dependencies. As seen in the drawing plotting the reaction rate constant versus temperature, a larger value of A produces a rather sharp increase in K at a well-defined temperature, while a low value produces a more gradually increasing k.

The Arrhenius equation can be substituted for k in the first order reaction rate relationship to provide a relationship between an observed change in concentration and temperature:

Eqn. 4: $ln([Ci]/[Ct])=At$ where:

[Ci]=initial concentration of C; and

[Ct]=concentration of C at time t.

Thus, by the foregoing equation, given a well-characterized, first order chemical reaction where A and Ea have been determined, accurate measurements of time, and initial and final concentrations, it is possible to determine the time average temperature at which a reaction took place.

The foregoing analysis assumes a number of ideal conditions which are unlikely under actual processing conditions, such as a constant temperature during the entire reaction, and ideal first order kinetics. However, the analysis does illustrate that a direct, invariant mathematical relationship exists between the extent of a chemical reaction and its thermal history. To improve accuracy, permit a wider temperature measurement range, and reduce degeneracy of the relationship, the change in concentrations of more than one, non-interacting materials are preferably determined.

The foregoing principles are used in the method according to the present invention. In the method, the temperature that an object reaches during heating is determined by applying, to a surface of an object, a thermally sensitive material which, when heated, undergoes a gradual irreversible change. The object and the material applied thereto are heated. An amount of irreversible change in the heated material applied on the object is then determined. Thus, a gradual irreversible change, in the sense used here, is one which, for the temperatures and times involved in the specific heating operation; is preferably less than a complete change so that the amount of change is a largely function of temperature and time.

The specific gradual irreversible change that the material undergoes may be of any detectable character. The gradual irreversible change may, for example, be a chemical change, a physical change, or an optical change.

In the case of optical changes, the gradual irreversible change is preferably a change in optical adsorption characteristics of the material. Optical measurement of the concentrations of colored materials via transmission or reflectance at a suitable wavelength is well-known. The change in optical adsorption characteristics is preferably determined by reflectance spectral photometry. Equipment such as the FT650, FT750, UV1050, and UV1250 film thickness measuring devices available from Tencore, Mountainview, Calif., which measure film thickness by means of spectral reflectance, may be used to determine the change.

The thermally sensitive material preferably includes one or more heat sensitive dyes contained in an inert material. In one embodiment, the dyes are basic, and may be of the type used in well-known pH indicator strips. The inert material is preferably a carrier such as a spin-on-glass or a polymeric material such as photoresist. A transparent carrier is preferred for embodiments wherein changes in color or related characteristics are determined.

The inert material containing the dye or dyes is coated onto the object, such as a semiconductor wafer, using standard semiconductor processing techniques and equipment. The thinness of the applied layer and, in the case of objects such as semiconductor wafers, its similarity to normally used materials ensures that the measured temperatures will correlate well to actual temperatures of the object.

Prior to processing, i.e., heating, the concentration of the thermally sensitive material is preferably initially measured over the entire object and/or at various points on the object. Where gradual irreversible optical changes are being measured, the concentration, e.g., of a particular color, is preferably measured via reflectance at a suitable wavelength. The object is then exposed to the desired processing conditions. After processing, the concentration of the thermally sensitive material is again determined over the entire object and/or at the various points on the object. A map of the concentration of the thermally sensitive material after processing reflects temperature distribution on the object, i.e., that certain areas reached greater or lesser temperatures than other areas.

Further, knowing the initial concentration [Ci], the concentration at time [Ct], the reaction rate constant k, the elapsed time t, the characteristic constant of the reaction A, the activation energy of the reaction Ea, and the gas constant R, it is possible to solve for T over the entire object and/or at the various points using Equation 4, above, and thereby map the temperatures reached by the object during processing at the different points over the entire object and/or at the various points. Thus, from the multiple continuous or discrete temperature measurements, a map of actual temperatures reached by the object is produced.

The use of a single thermally sensitive material permits a determination of an average temperature of the object or a point on the object during processing. By using several different materials having different absorption maxima (colors) and different reaction rate constants, the range and sensitivity of a single coating material is extended. For example, if several different dyes, each having different reaction rate constants, are mixed with an inert material to create a "paint" that is coated on an object to be processed, since each dye is subjected to the same heating, the temperature of the object at various times during processing can be estimated. In other words, the more independent measurements that can be obtained, i.e., through the use of multiple dyes, the better that the time versus temperature profile can be established.

It is preferred to use the method according to the present invention in conjunction with processing systems that involve substantially constant or steadily increasing or decreasing heating. However, temperatures of the object can be determined where heating is characterized by repeated increases and decreases in heating, i.e., a sawtooth, in that the estimated temperature of the object is an integral of the sawtooth pattern.

Factors in selecting the carrier material that contains the thermally sensitive material preferably include its compatibility with gases present during processing, compatibility with processing temperatures, interaction, or lack thereof, with the thermally sensitive material or materials, cost, and method of application. Factors in selecting the thermally sensitive material preferably include its temperature range and sensitivity, the type of gradual irreversible change that the material undergoes during processing, e.g., color, refractive index, etc., its compatibility with the carrier, i.e., matrix effect, cost, and shelf life.

It will be appreciated that the method according to the present invention does not involve real time temperature measurements. The method offers the advantages of high spatial resolution, and permits a detailed temperature map to be generated. The method further permits the detailed temperature map to be generated without the need for modifications to the process equipment. The method permits generation of a temperature map over a wide range of temperatures, in that temperature sensitivity is determined by the choice of the thermally sensitive material.

The method is of primary value in determining temperatures of test samples in processing operations that involve well-characterized materials and methodology, i.e., wherein identical processing conditions are repeated. Ordinarily, it will be desired to obtain a more uniform temperature throughout the object being processed. The temperature map produced according to the present invention facilitates obtaining preferred temperature distributions or uniformity by suggesting various causes and remedies for undesired or uneven temperatures. For example, if an asymmetrical temperature map results from processing, where the asymmetry corresponds to the location of gas feed holes in the chuck behind the wafer, a more even temperature distribution may be provided by relocating the gas feed holes.

Generally speaking, control of semiconductor wafer temperature is permitted through either control of power and heat input to and power or heat removal from the plasma reaction chamber and thence the wafer. Power and heat inputs can include the direct input and distribution of RF power, chemical energy from the chemical reactions that occur during processing, and radiation from other sources in the processing chamber. Power and heat removal is similarly a function of processing factors such as the temperature of the chuck supporting the wafer, which may include factors such as the mass of the chuck, and the manner, if any, in which the chuck is cooled, which may include factors such as gas feed distribution in the plasma reaction chamber, and characteristics such as positioning, size, and quantity of cooling channels and other heat removing mechanisms within the plasma reaction chamber. Additional factors relating to the removal of heat or power from the chamber and the wafer include the size of a gap between the wafer and the chuck, such as surface features of the chuck that determine a size of a gap between the wafer and the chuck at specific locations or areas. Removal of heat and power is also a function of delivery and/or distribution of coolant gas between the wafer and a chuck, which can affect heat removal capability at specific locations or areas, and the pressure of a gas such as helium between the wafer and the chuck. By observing the distribution of temperatures reached by the semiconductor wafer during processing on a temperature map produced according to the present invention, the various power and heat input and power and heat removal factors can be selectively varied or modified to obtain desired temperature distribution or uniformity.

The method permits generation of a detailed temperature map at low cost, in that only small amounts of common materials are required for a test. Moreover, test objects, such as semiconductor wafers, may be cleaned and reused, if desired. The method may be performed quickly, particularly where automated optical equipment is used in conjunction with computers programmed to automatically map and display temperature distributions on an object.

In accordance with another embodiment of the present method, the gradual irreversible change in the temperature sensitive material is a change in refractive index of the material, such as through the loss of a volatile material from within the carrier. According to another embodiment of the present invention, the gradual irreversible change is a change in light scattering of the thermally sensitive material, such as through nucleation and growth of particles in the matrix.

According to still another embodiment of the present invention, the gradual irreversible change is a change in electrical characteristics of the material, such as a change in resistance resulting from the diffusion of impurities into a silicon substrate. According to yet another embodiment of the present invention, the gradual irreversible change is a change in chemical composition of the material, such as through the loss of $H_2$ or other substances from the material.

While this invention has been illustrated and described in accordance with a preferred embodiment, it is recognized that variations and changes may be made therein without departing from the invention as set forth in the claims.

What is claimed is:

1. A method for mapping temperatures reached by an object during heating, comprising the steps of:
    applying, to a surface of an object, a thermally sensitive material which, when heated, undergoes a reaction in which the material experiences an irreversible change as a function of time;
    heating the object and the material applied thereto; and
    determining an amount of the irreversible change in the heated material applied on the object, the amount of irreversible change in the heated material being indicative of temperatures reached at multiple points on the object.

2. The method as set forth in claim 1, wherein the irreversible change includes a change in property of the heated material.

3. The method as set forth in claim 2, comprising the step of determining the temperature that the object reaches during heating is determined by solving for T in the equation:

$$ln([Ci]/[Ct])=At^{(-Ea/RT)}$$

where:
    [Ci]=refractive index of the material [C] prior to heating;
    [Ct]=refractive index of the material [C] at a time [t] elapsed after beginning heating;
    k=rate constant of the reaction at temperature T;
    t=the time elapsed after beginning heating;
    A=a characteristic constant of the reaction;
    Ea=activation energy of the reaction;
    R=Universal gas constant (8.31431 joules/° K. mole);
    T=Temperature, ° K.

4. The method as set forth in claim 1, wherein the irreversible change includes a chemical change.

5. The method as set forth in claim 1, wherein the irreversible change includes a physical change.

6. The method as set forth in claim 1, wherein the irreversible change includes a change in refractive index of the heated material.

7. The method as set forth in claim 1, wherein the irreversible change includes a change in light scattering of the heated material.

8. The method as set forth in claim 1, wherein the irreversible change includes a change in electrical characteristics of the heated material.

9. The method as set forth in claim i, wherein the irreversible change includes an optical change in the heated material.

10. The method as set forth in claim 9, wherein the irreversible change includes a change in optical adsorption characteristics of the heated material.

11. The method as set forth in claim 10, wherein the change in optical adsorption characteristics is determined by reflectance spectral photometry.

12. The method as set forth in claim 1, wherein the material includes one or more heat sensitive dyes contained in a transparent inert material.

13. The method as set forth in claim 12, wherein the inert material is a polymeric material.

14. The method as set forth in claim 12, wherein the inert material is a spin-on-glass material.

15. The method as set forth in claim 1, wherein the material includes a plurality of thermally sensitive materials, the method comprising the step of determining, based on an amount of irreversible change in the heated materials applied on the object after an end of heating, of a temperature reached by the object at a time during heating.

16. The method as set forth in claim 1, wherein the amount of irreversible change in the material at the multiple points is determined continuously at different points on the object.

17. The method as set forth in claim 1, wherein the amount of irreversible change in the material at the multiple points is determined discretely at various points on the object.

18. The method as set forth in claim 1, wherein the heating step is carried out in a plasma reaction chamber while simulating plasma etching of a layer on a semiconductor layer.

19. A method for monitoring semiconductor wafer processing equipment, comprising the steps of:

(i) producing a temperature map of temperatures reached by a semiconductor wafer during processing in a plasma reaction chamber, the temperature map being produced by applying, to a surface of a semiconductor wafer, a thermally sensitive material which, when heated, undergoes a reaction in which the material experiences an irreversible change as a function of time, placing the semiconductor wafer in the plasma reaction chamber and heating the semiconductor wafer and the material applied thereto for a period of time, and determining an amount of irreversible change in the heated material applied on the semiconductor wafer at multiple points on the semiconductor wafer; and (ii) subsequently adjusting semiconductor wafer processing conditions of the plasma reaction chamber based on the amount and pattern of irreversible change.

20. The method as set forth in claim 19, wherein step (i) is repeated at least once.

21. The method as set forth in claim 19, wherein semiconductor wafer processing conditions are adjusted such that the temperature of a subsequently processed semiconductor wafer is more uniform.

22. The method as set forth in claim 19, wherein step (ii) includes varying RF power distribution to the plasma reaction chamber.

23. The method as set forth in claim 19, wherein step (ii) includes modifying gas feed distribution in the plasma reaction chamber.

24. The method as set forth in claim 19, wherein step (ii) includes modifying at least one of cooling channels and other heat removing mechanisms within the plasma reaction chamber.

25. The method as set forth in claim 19, wherein step (ii) includes modifying surface features of the chuck in order to adjust a gap between the wafer and the chuck.

26. The method as set forth in claim 19, wherein step (ii) includes modifying at least one of delivery or distribution of coolant gas between the wafer and a chuck so as to vary a heat removal capability at specific locations or areas.

27. A method for mapping temperatures reached by an object during heating, comprising the steps of:

applying, to a surface of an object, a thermally sensitive material which, when heated, undergoes a first order chemical reaction in which the material experiences an irreversible change as a function of time;

heating the object and the material applied thereto; and determining an amount of the irreversible change in the heated material applied on the object, the amount of irreversible change in the heated material being indicative of temperatures reached at multiple points on the object.

* * * * *